United States Patent
Anderson et al.

(10) Patent No.: US 9,536,882 B2
(45) Date of Patent: Jan. 3, 2017

(54) FIELD-ISOLATED BULK FINFET

(71) Applicant: GLOBALFOUNDRIES INC., Grand Cayman (KY)

(72) Inventors: Brent A. Anderson, Jericho, VT (US); Edward J. Nowak, Essex Junction, VT (US); Robert R. Robison, Colchester, VT (US); Andreas Scholze, Colchester, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/574,504

(22) Filed: Dec. 18, 2014

(65) Prior Publication Data

US 2016/0181247 A1 Jun. 23, 2016

(51) Int. Cl.
*H01L 27/092* (2006.01)
*H01L 21/8238* (2006.01)
(Continued)

(52) U.S. Cl.
CPC ..... *H01L 27/0924* (2013.01); *H01L 21/32115* (2013.01); *H01L 21/32133* (2013.01);
(Continued)

(58) Field of Classification Search
CPC ............ H01L 27/0924; H01L 21/32115; H01L 21/32133; H01L 29/0607; H01L 29/0649; H01L 21/823871; H01L 21/823892; H01L 21/0928; H01L 21/823821; H01L 29/16; H01L 29/1095; H01L 29/1037
See application file for complete search history.

(56) References Cited

U.S. PATENT DOCUMENTS 7,268,400 B2 9/2007 Cecchi et al.
7,288,802 B2 10/2007 Anderson et al.
(Continued)

FOREIGN PATENT DOCUMENTS

| EP | 2557479 | 2/2013 |
|---|---|---|
| EP | 2560209 | 2/2013 |
| WO | 2008036047 | 3/2008 |

OTHER PUBLICATIONS

C.-H. Lee et al., "Novel body tied FinFET cell array transistor DRAM with negative word line operation for sub 60nm technology and beyond," Symposium on VLSI Technology, 2004, pp. 130-131.
(Continued)

*Primary Examiner* — Michelle Mandala
(74) *Attorney, Agent, or Firm* — Gibb & Riley, LLC; Michael J. LeStrange, Esq.

(57) ABSTRACT

Disclosed are isolation techniques for bulk FinFETs. A semiconductor device includes a semiconductor substrate with a fin structure on the semiconductor substrate. The fin structure is perpendicular to the semiconductor substrate and has an upper portion and a lower portion. Source and drain regions are adjacent to the fin structure. A gate structure surrounds the upper portion of the fin structure. A well contact point is provided in the semiconductor substrate. The lower portion of the fin structure includes a sub-fin between the region surrounded by the gate structure and the semiconductor substrate. The sub-fin directly contacts the semiconductor substrate. The upper portion of the fin structure and an upper portion of the sub-fin are undoped. A lower portion of the sub-fin may be doped. Electrical potential applied from the well contact point to the lower portion of the sub-fin reduces leakage currents from the upper portion of the fin structure.

13 Claims, 13 Drawing Sheets

(51) Int. Cl.
*H01L 21/3213* (2006.01)
*H01L 21/321* (2006.01)
*H01L 29/10* (2006.01)

(52) U.S. Cl.
CPC ........... *H01L 21/823821* (2013.01); *H01L 21/823871* (2013.01); *H01L 21/823892* (2013.01); *H01L 27/0928* (2013.01); *H01L 29/1087* (2013.01)

(56) References Cited

U.S. PATENT DOCUMENTS

| | | |
|---|---|---|
| 7,358,573 B2 | 4/2008 | Cecchi et al. |
| 7,700,446 B2 | 4/2010 | Anderson et al. |
| 7,994,583 B2 | 8/2011 | Inaba |
| 8,227,316 B2 | 7/2012 | Zhu et al. |
| 8,643,108 B2 | 2/2014 | Rahim et al. |
| 8,723,592 B2 | 5/2014 | Meijer et al. |
| 2008/0308848 A1* | 12/2008 | Inaba .................... G11C 11/412 257/255 |
| 2011/0169101 A1 | 7/2011 | Doornbos et al. |
| 2014/0159162 A1 | 6/2014 | Cai et al. |
| 2014/0306274 A1* | 10/2014 | Basker .................. H01L 29/785 257/288 |

OTHER PUBLICATIONS

X. Sun et al., "Tri-gate bulk MOSFET design for CMOS scaling to the end of the roadmap," IEEE Electron Device Letters, vol. 29, No. 5, 2008, pp. 491-493.
K.-R. Han et al., "Design of Bulk Fin-Type Field-Effect Transistor Considering Gate Work-Function," Japanese Journal of Applied Physics, vol. 47, No. 6, 2008, pp. 4385-4391.

\* cited by examiner

FIELD-ISOLATED BULK FINFET

BACKGROUND

The present disclosure relates to semiconductors and, more particularly, to structures and methods for forming field-isolated bulk fin field effect transistor (FinFET).

The industry has begun to convert to bulk-based FinFET CMOS recently. One detriment of bulk isolation of the FinFET is the need to dope the fins, and in particular, the sub-fin, which is the region below the gate and between the source and drain. Doping of the sub-fin may be used in order to avoid punch-through leakage. SOI-based FinFETs avoid this problem, but require SOI starting wafers. Techniques to create oxide isolation under a bulk-based FinFET integration also have been demonstrated but are costly and bring other compromises to the devices.

SUMMARY

According to exemplary semiconductor devices described herein, a semiconductor device includes a semiconductor substrate. A fin structure is on the semiconductor substrate. The fin structure is perpendicular to the semiconductor substrate and comprises an upper portion and a lower portion. A source region and a drain region are adjacent to the fin structure. A gate structure surrounds the upper portion of the fin structure. A well contact point is provided in the semiconductor substrate. The lower portion of the fin structure comprises a sub-fin between the region surrounded by the gate structure and the semiconductor substrate. The sub-fin directly contacts the semiconductor substrate. The upper portion of the fin structure and an upper portion of the sub-fin are undoped. A lower portion of the sub-fin is doped. An electrical potential applied from the well contact point to the lower portion of the sub-fin reduces leakage currents from the upper portion of the fin structure.

According to an exemplary semiconductor device a bulk silicon wafer has a top surface and a bottom surface. A conductive layer is formed on the top surface of the silicon wafer. The conductive layer has a well contact point. An oxide layer is formed on the conductive layer. The conductive layer is between the silicon wafer and the oxide layer. The conductive layer comprises a well region. A fin structure extends through the oxide layer. The fin structure comprises an upper portion and a lower portion. The upper portion of the fin structure is undoped. A source region and a drain region are provided adjacent to the fin structure. A gate structure surrounds the upper portion of the fin structure. The source and drain regions and the gate structure define a fin field effect transistor (FinFET). The lower portion of the fin structure comprises a sub-fin between the region surrounded by the gate structure and the bulk silicon wafer. The sub-fin comprises an upper portion and a lower portion. The upper portion of the sub-fin is undoped. The lower portion of the sub-fin is doped. A portion of the well region of the conductive layer comprises part of the lower portion of the sub-fin. An electrical potential applied from the well contact point to the lower portion of the sub-fin reduces leakage currents from the upper portion of the fin structure.

According to an exemplary method herein, a bulk silicon wafer is provided. The bulk silicon wafer has a top surface and a bottom surface. A conductive layer is formed on the top surface of the silicon wafer. A portion of the conductive layer is doped. A fin structure is formed in the conductive layer. The fin structure comprises an upper portion and a lower portion. The upper portion of the fin structure is undoped. The lower portion of the fin structure comprises a sub-fin. The sub-fin comprises an upper portion and a lower portion. The upper portion of the sub-fin is undoped. The lower portion of the sub-fin is optionally doped. A gate structure is formed surrounding the upper portion of the fin structure. Source and drain regions are formed adjacent to the fin structure. The source and drain regions and the gate structure define a fin field effect transistor (FinFET). An electrical potential is applied to the conductive layer and optionally to the lower portion of the sub-fin, reducing leakage currents below the upper portion of the fin structure.

According to another example, a non-transitory computer readable storage medium readable by a computerized device is disclosed. The non-transitory computer readable storage medium stores instructions executable by the computerized device to perform an isolation technique for bulk fin field effect transistors (FinFETs). According to the method, a bulk silicon wafer having a top surface and a bottom surface is provided. A conductive layer is formed on the top surface of the silicon wafer. A portion of the conductive layer is doped. An oxide layer is formed on the conductive layer. The conductive layer is between the silicon wafer and the oxide layer. The conductive layer comprises a well region. A fin structure extends through the oxide layer. The fin structure comprises an upper portion and a lower portion. The upper portion of the fin structure is undoped. A gate structure surrounds the upper portion of the fin structure. Source and drain regions are formed adjacent to the fin structure. The source and drain regions and the gate structure define a fin field effect transistor (FinFET). The lower portion of the fin structure comprises a sub-fin extending below the region surrounded by the gate structure. The sub-fin comprises an upper portion and a lower portion. The upper portion of the sub-fin is undoped. The lower portion of the sub-fin is optionally doped in which case a portion of the well region of the conductive layer comprises part of the lower portion of the sub-fin.

BRIEF DESCRIPTION OF THE DRAWINGS

The foregoing and other exemplary purposes, aspects, and advantages will be better understood from the following detailed description of exemplary systems and methods herein with reference to the attached drawing figures, which are not necessarily drawn to scale and in which.

DETAILED DESCRIPTION

Figure 1:
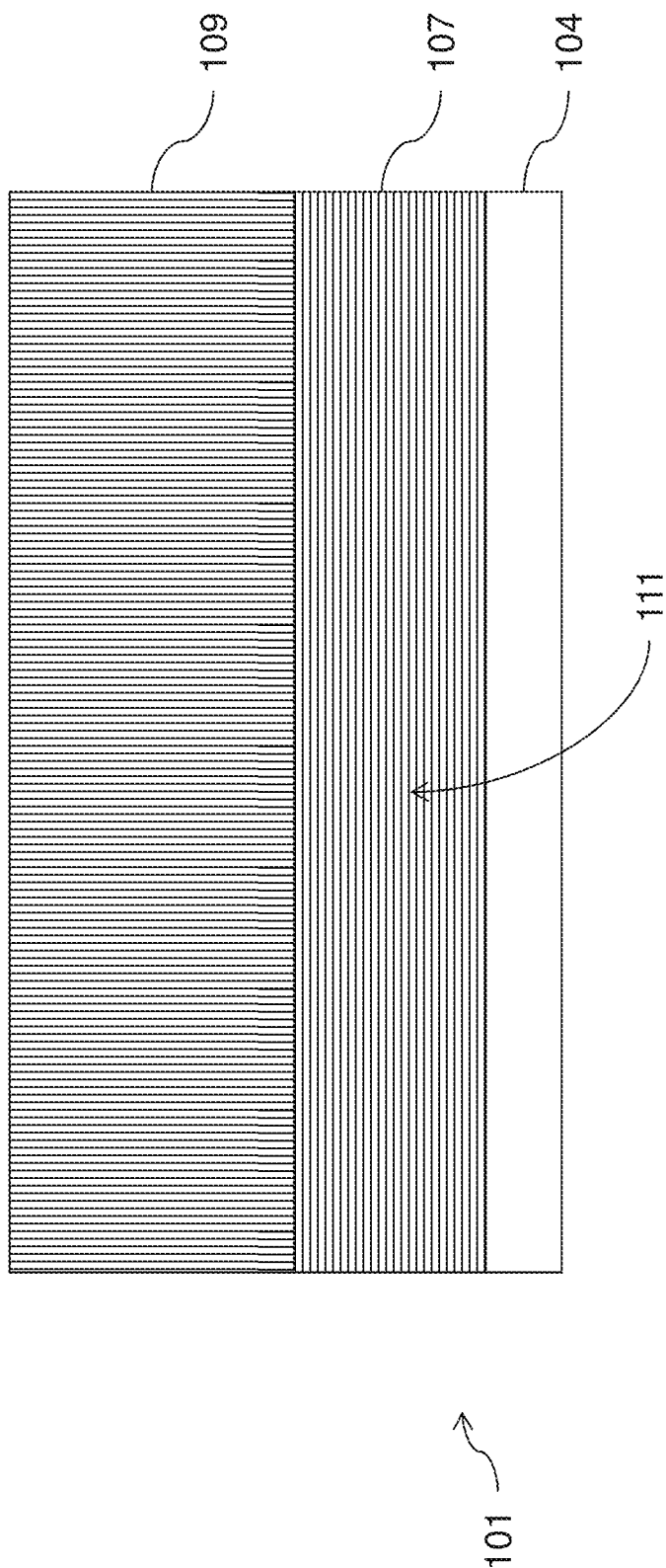
FIGS. 1-4 are schematic diagrams of a sectional view of semiconductor structure in fabricating a FinFET structure according to systems and methods herein.

Referring now to the drawings, there are shown exemplary illustrations of the structures of a field-isolated bulk fin field effect transistors (FinFET) in a semiconductor wafer and method of forming such structure.

For purposes herein, a "semiconductor" is a material or structure that may include an implanted impurity that allows the material to sometimes be a conductor and sometimes be an insulator, based on electron and hole carrier concentration. As used herein, "implantation processes" can take any appropriate form (whether now known or developed in the future) and can comprise, for example, ion implantation, etc.

According to devices and methods herein, a novel combination of elements can be used to enable electric-field isolation of the sub-fin regions in a bulk FinFET. The structure described below may be combined with electrical global biases using a work-function change, doping profile, and well interconnect schemes that suppress source-drain punch-through/leakage without requiring high channel doping nor high punch-through stop. Additionally, the structure described below provides an improved well structure to enable bias to p-wells while keeping the substrate at ground potential in order to enable low-cost heat sink attachment.

Referring to the drawings, FIG. 1 shows a multi-layer wafer, indicated generally as 101. The multi-layer wafer 101 may include a bulk silicon layer 104, a conductive layer 107, and a substantially undoped upper layer 109. The conductive layer 107 may include a doped portion, such as well region 111. Such a multi-layer wafer 101 may be fabricated by any of a number of known methods. One sequence, for instance, is to employ a conventional starting bulk silicon layer 104, then growing doped epitaxial regions on portions of the bulk silicon layer 104, followed by growth of a substantially undoped upper layer 109. According to structures and methods herein, some layers may be lightly doped with a p-type impurity species, such as boron, to render it p-type in which holes are the majority carriers and dominate the electrical conductivity of the constituent semiconductor material. Some layers may be lightly doped with an n-type impurity species, such as arsenic to render it n-type in which electrons are the majority carriers and dominate the electrical conductivity of the semiconductor material.

Figure 2:
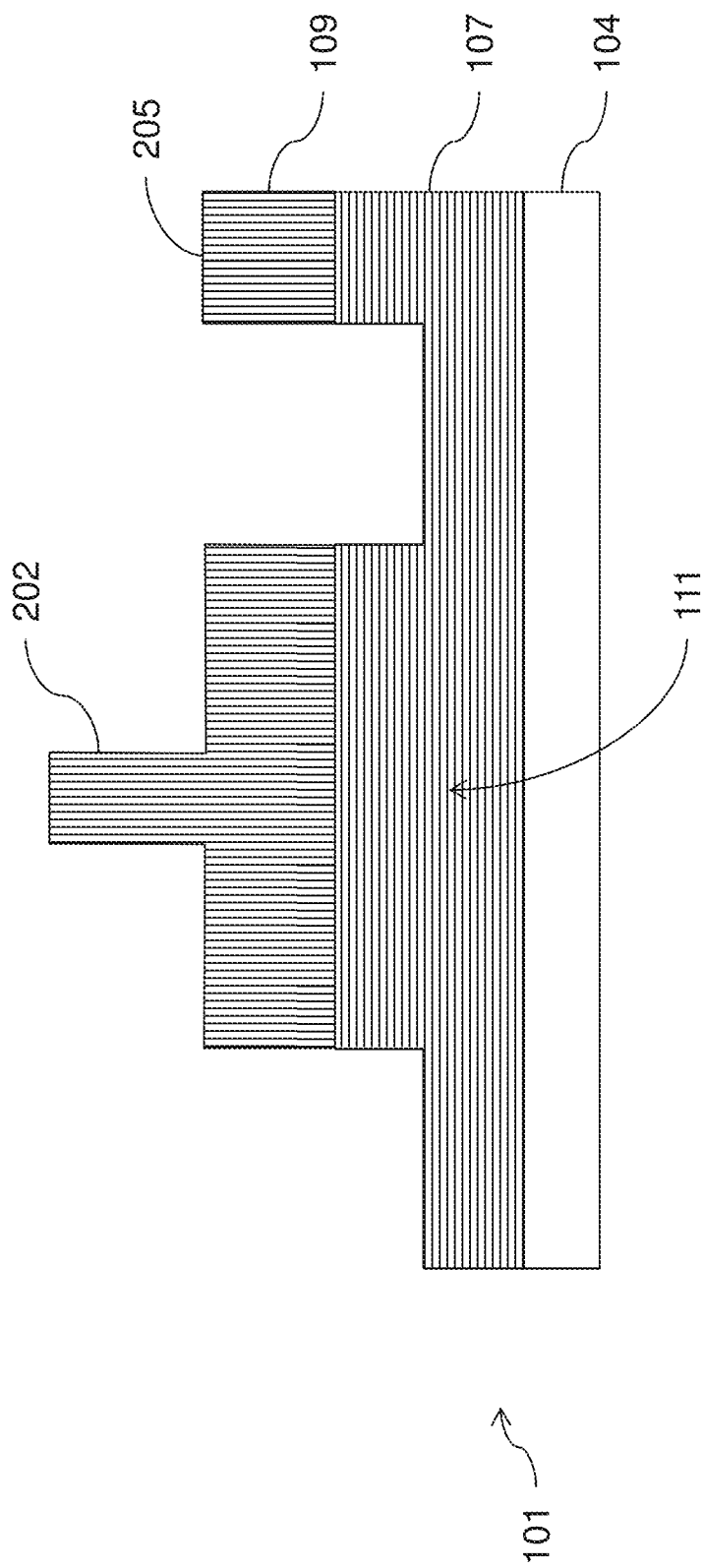

In FIG. 2, the multi-layer wafer 101 has been patterned to define the fin structure 202 for the FinFET and a well contact point 205. In practice, the undoped upper layer 109 and the conductive layer 107 may be etched using any appropriate etching process. For example, a subtractive etching process, such as a reactive-ion etching (RIE) process or a wet chemical etching process, can be used to remove regions of the conductive layer 107 not protected by a mask layer.

The fin structure 202 is substantially perpendicular to the bulk silicon layer 104. Note: the fin structure 202 may be formed by any appropriate method, whether now known or developed in the future, such as planarizing the undoped upper layer 109 and etching back to expose the fin structure 202.

Figure 3:
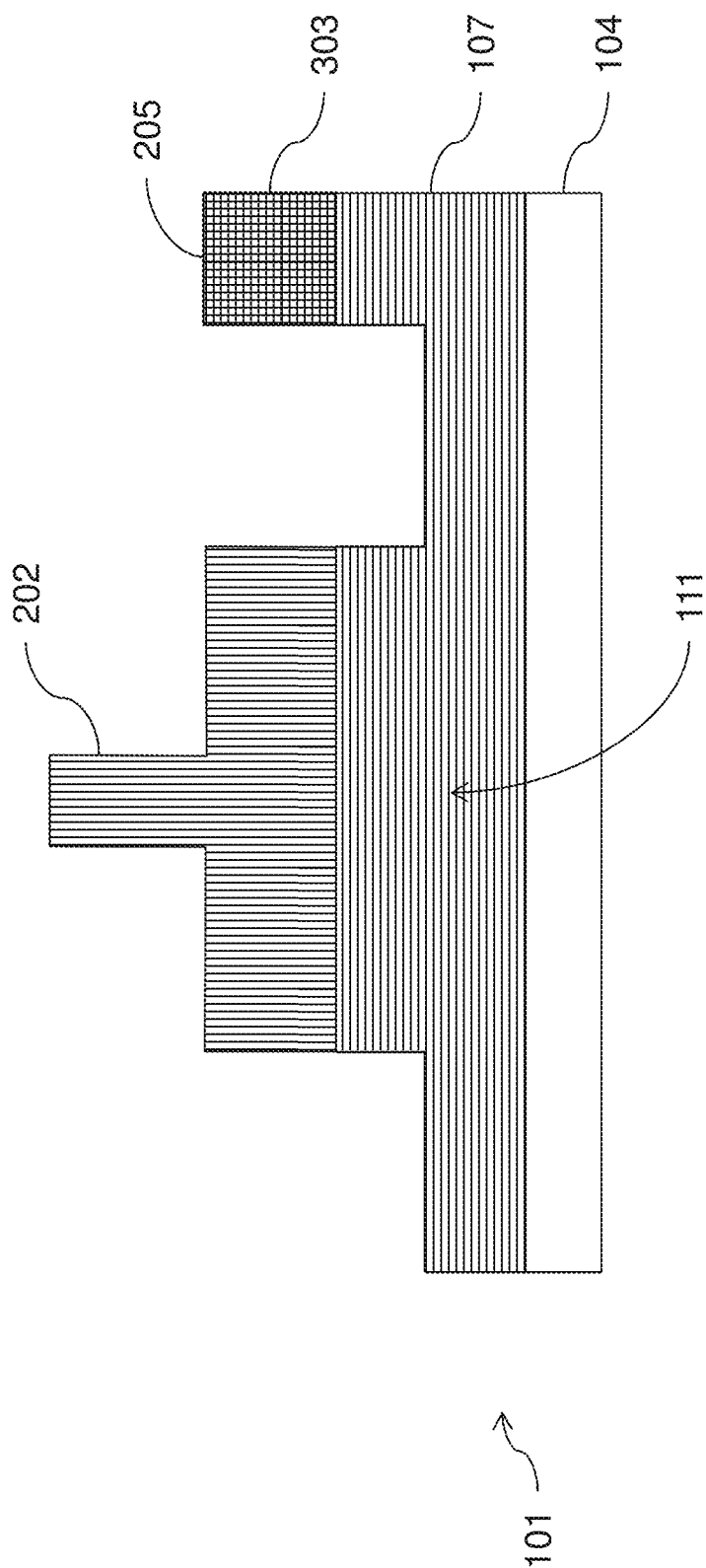

As illustrated in FIG. 3, a masked ion implantation process may be performed to selectively dope the well contact 303 with the same impurity type as the well region 111 in order to provide electrical continuity from the well region 111 to the well contact point 205. Other methods may be used to provide electrical continuity with the well region 111.

The mask layer protects portions of the structure while using a material removal process. A hardmask can be formed of any suitable material, whether now known or developed in the future, such as a metal or organic or inorganic ($Si_3N_4$, SiC, $SiO_2C$ (diamond)) hardmask, that has etch resistance greater than the substrate and insulator materials used in the remainder of the structure.

Figure 4:
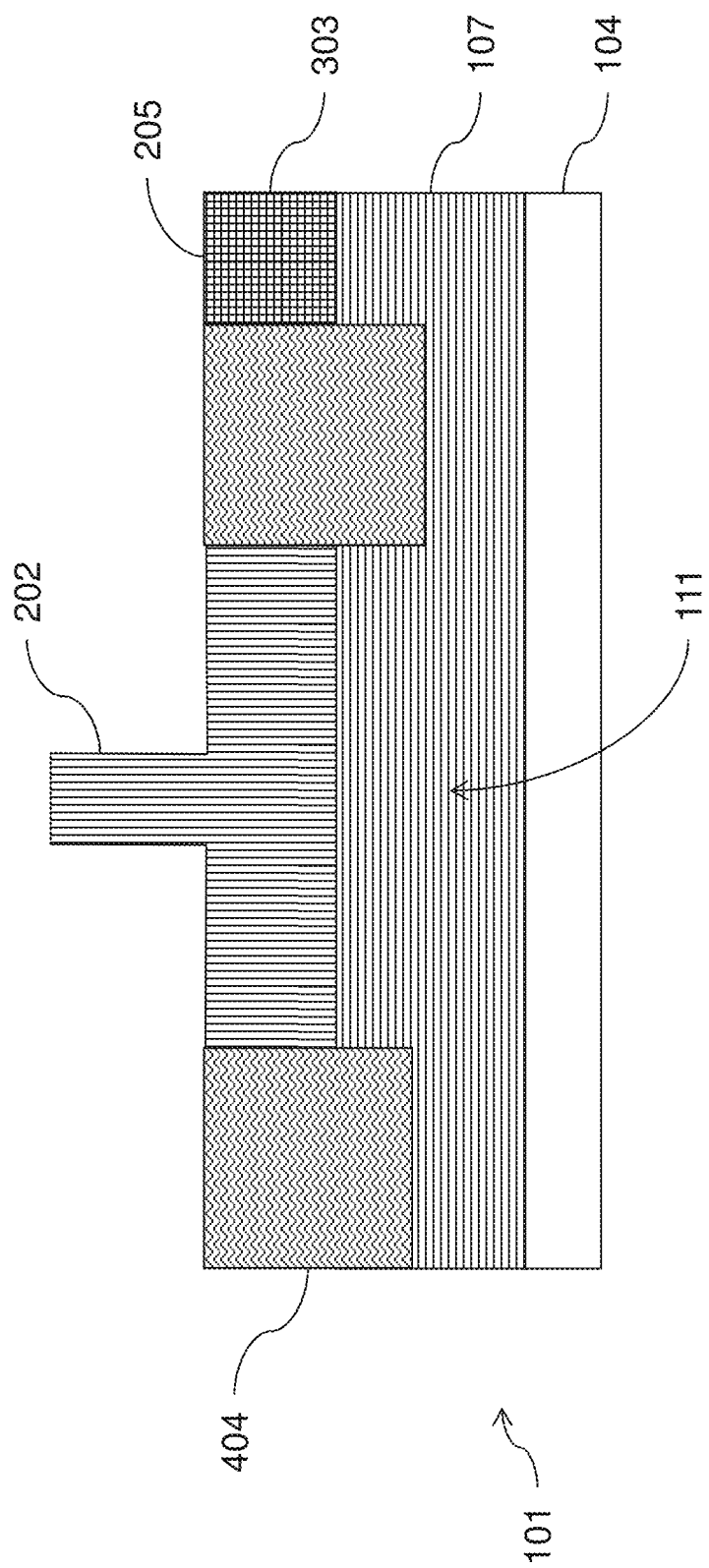

In FIG. 4, the mask is stripped away and an oxide 404 may be deposited over the open regions and exposed portions of the conductive layer 107. The oxide 404 may be applied using a plasma enhanced chemical vapor deposition (PECVD) process with a high hydrofluoric acid (HF) removal rate. As is known in the art, different oxide types etch differently. PECVD oxide usually etches faster in HF than other oxides, such as thermal oxides. Other methods may be used.

As is known in the art, during fabrication, the various layers may be cleaned and polished using a CMP (chemical-mechanical polishing) process. The CMP process combines abrasion and dissolution to remove excess material from the top surface of the layer. The details regarding low-k dielectrics used within semiconductor structures, pre-clean operations, CMP processing, etc., are discussed in U.S. Patent Publication 2007/0249156, which is incorporated herein by reference, and the details of such operations are not set forth herein.

The oxide 404 may be any appropriate insulator. For purposes herein, an "insulator" is a relative term that means a material or structure that allows no (many orders of magnitude difference) electrical current to flow than does a "conductor." The dielectrics (insulators) mentioned herein can, for example, be formed by plasma deposition of $SiO_2$ or $SiO_2$-based materials by reacting either tetra-ethyl-orthosilane (TEOS) or silane with O2 or activated O2, i.e. O3 or O—. Alternatively, the dielectrics herein may be formed from any of the many candidate high dielectric constant (high-k) materials, including but not limited to silicon nitride, silicon oxynitride, a gate dielectric stack of $SiO_2$ and $Si_3N_4$, and metal oxides like tantalum oxide. The thickness of dielectrics herein may vary contingent upon the required device performance.

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned. A material removal process is then performed (e.g., plasma etching, etc.) to remove the unprotected portions of the material to be patterned. The resist is subsequently removed to leave the underlying material patterned according to the light exposure pattern.

Figure 5:
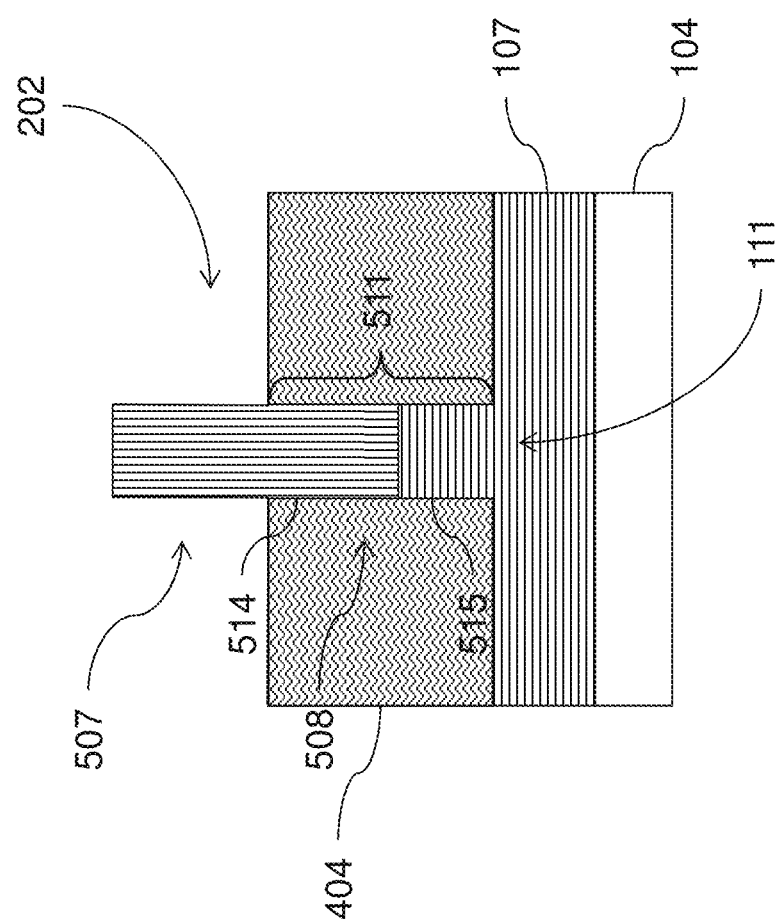
FIG. 5 is a side view of the FinFET structure of FIG. 4.

Referring to FIG. 5, which is a side view of the fin structure 202, the fin structure 202 includes an upper portion 507 relative to the well region 111 and a lower portion 508 relative to the well region 111. The lower portion 508 of the fin structure 202 comprises a sub-fin 511. The sub-fin 511 also includes an upper portion 514 relative to the well region 111 and a lower portion 515 relative to the well region 111. The upper portion 507 of the fin structure 202 and the upper portion 514 of the sub-fin 511 are undoped or relatively lightly doped. The lower portion 515 of the sub-fin 511 has a greater doping density relative to the upper portion 514 of the sub-fin 511. Depending on the anticipated use of the FinFET, the doped region may be either p-doped or n-doped.

Figure 6:
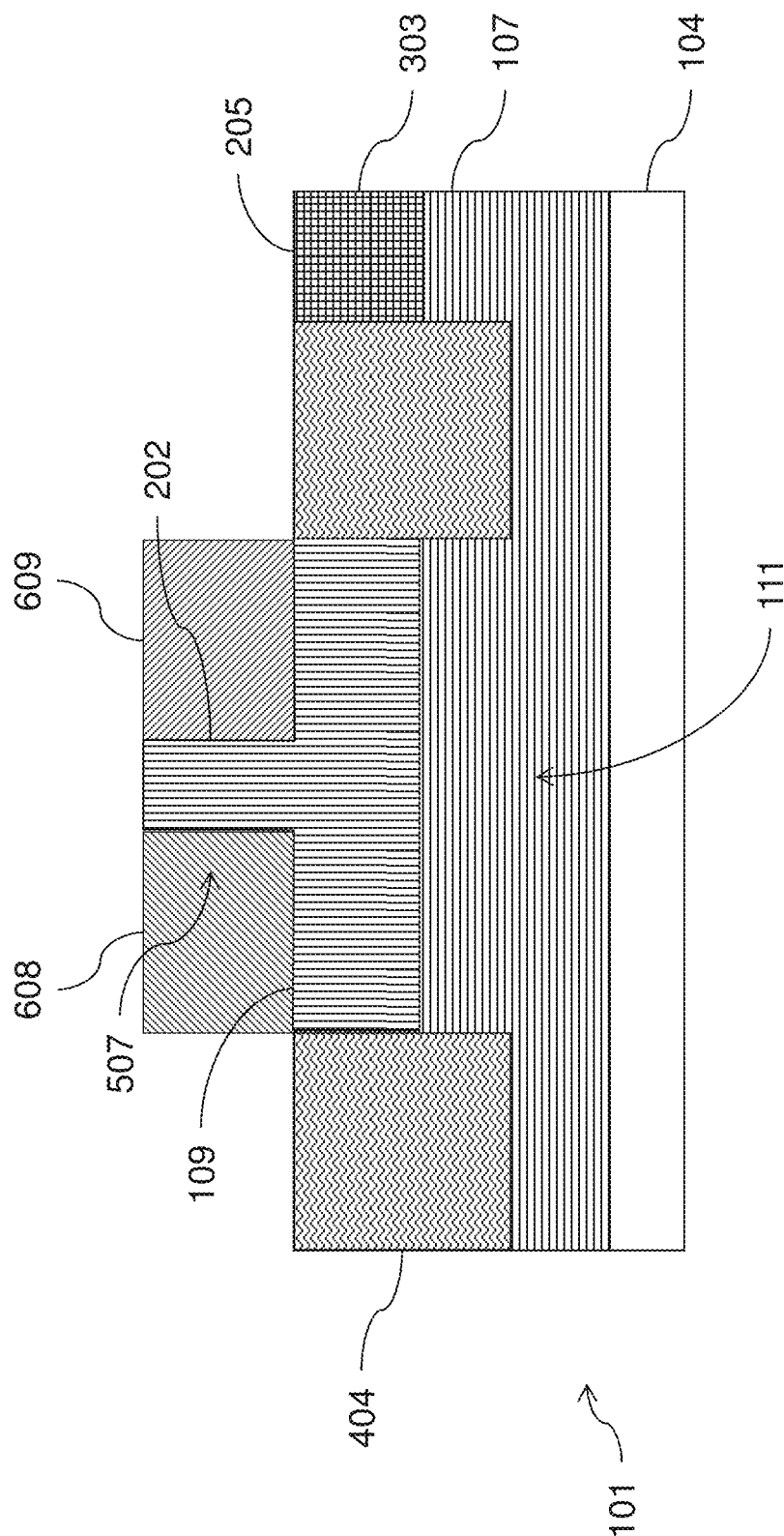
FIGS. 6 and 7 are schematic diagrams of a sectional view of semiconductor structure in fabricating a FinFET structure according to systems and methods herein.

In FIG. 6, source and drain regions 608, 609 are formed adjacent to the fin structure 202. The source and drain regions 608, 609 may be formed by growing doped silicon epitaxially on the exposed top of the undoped upper layer 109.

Figure 7:
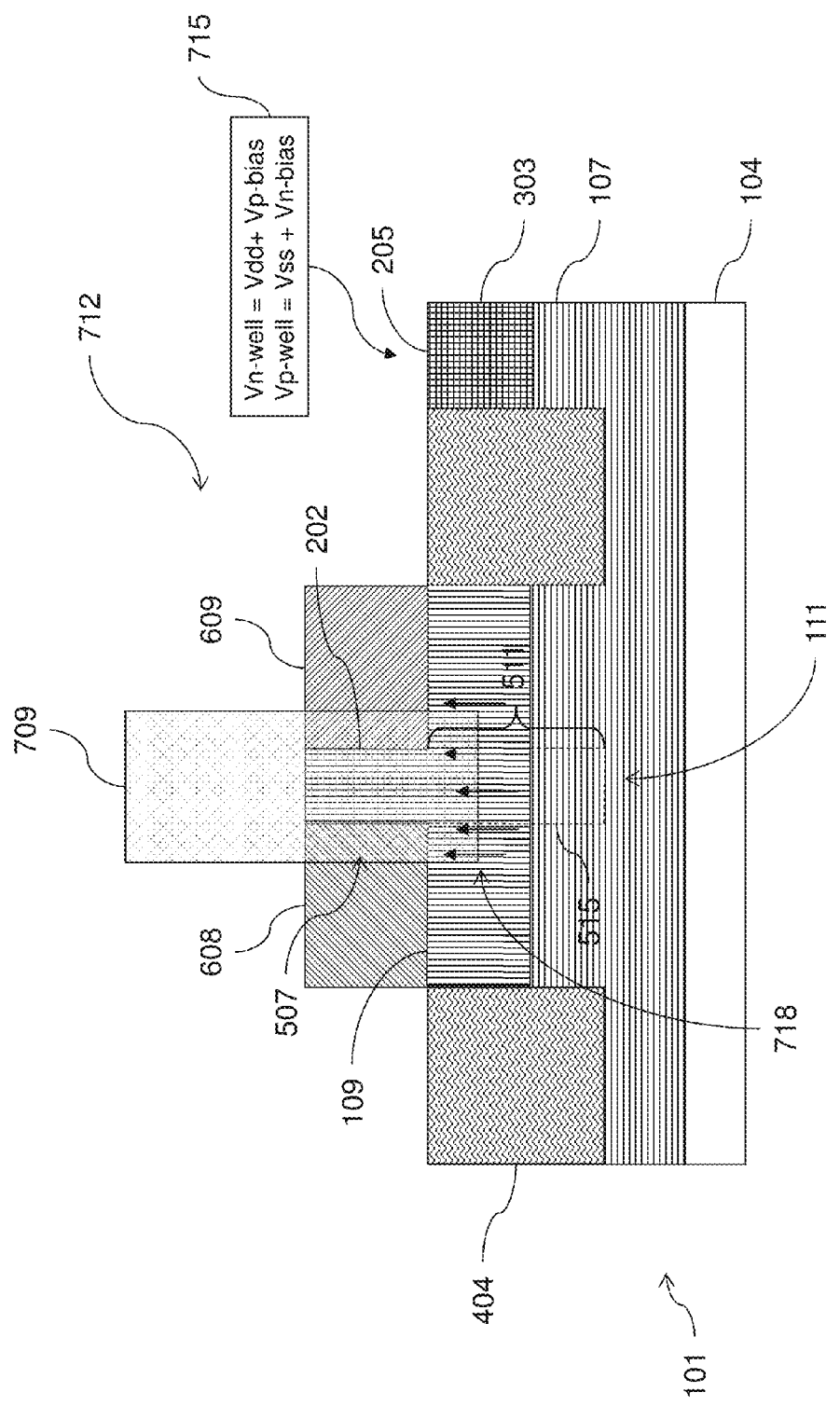

In FIG. 7, a gate structure 709 is formed surrounding the upper portion 507 of the fin structure 202. According to devices and methods herein, the sub-fin 511 is defined as being between the region of the fin structure 202 surrounded by said gate structure 709 and the top of the well region 111 relative to the bulk silicon layer 104. The source and drain regions 608, 609 and the gate structure 709 constitute the three main connection points for a fin field effect transistors (FinFET), indicated generally as 712.

The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, nickel, or a metal silicide, any alloys of such metals, and may be deposited using physical vapor deposition, chemical vapor deposition, or any other technique known in the art.

The structure described herein enables a unique isolation technique for bulk FinFETs. As shown in FIG. 7, during operation of the FinFET 712, an electrical potential 715 is applied at the well contact point 205, which creates an electric field in the well region 111. The electric field, indicated by arrows 718, from the well bias confines minority carriers to the gated-region of the fin structure 202, between the source and drain regions 608, 609. In other words, when an electrical potential is applied to the doped lower portion 515 of the sub-fin 511, the doping in the lower portion 515 of the sub-fin 511 prevents leakage current from the lower portion 515 of sub-fin 511 into the well region 111. This reduces leakage currents below the upper portion 507 of the fin structure 202. The electric field 718 does NOT change the threshold voltage (Vt) of the FinFET 712. That is, the active fin is left unperturbed with well bias while sub-fin 511 leakage is suppressed.

Figure 8:
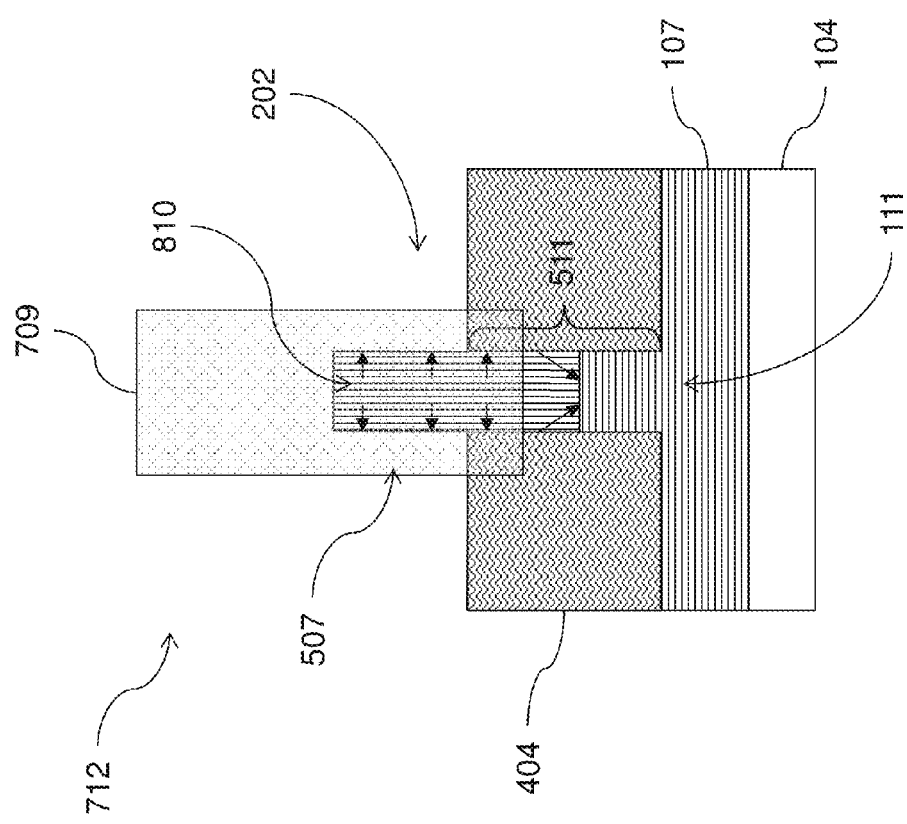
FIG. 8 is a side view of the FinFET structure of FIG. 9.

FIG. 8 is a side view of the FinFET structure shown in FIG. 7. Referring to FIG. 8, the field from the gate nearly exclusively controls the channel, as shown by arrows 810. The electric field 718 from the well region 111 is blocked from the channel by the gate structure 709. There is nearly no influence on the threshold voltage (Vt) of the FinFET 712, nor on the on-current.

The well region 111 is designed to keep doping out of the active areas of the fin structure 202 and out of the area of the sub-fin 511 closest to the bottom of the gate structure 909. According to devices and methods herein, the well is global between fins of a given type and circuit. That is, the FinFET 712 is engineered so that the field regions terminate below the active channel and only cuts off the non-gated leakage path.

Figure 9:
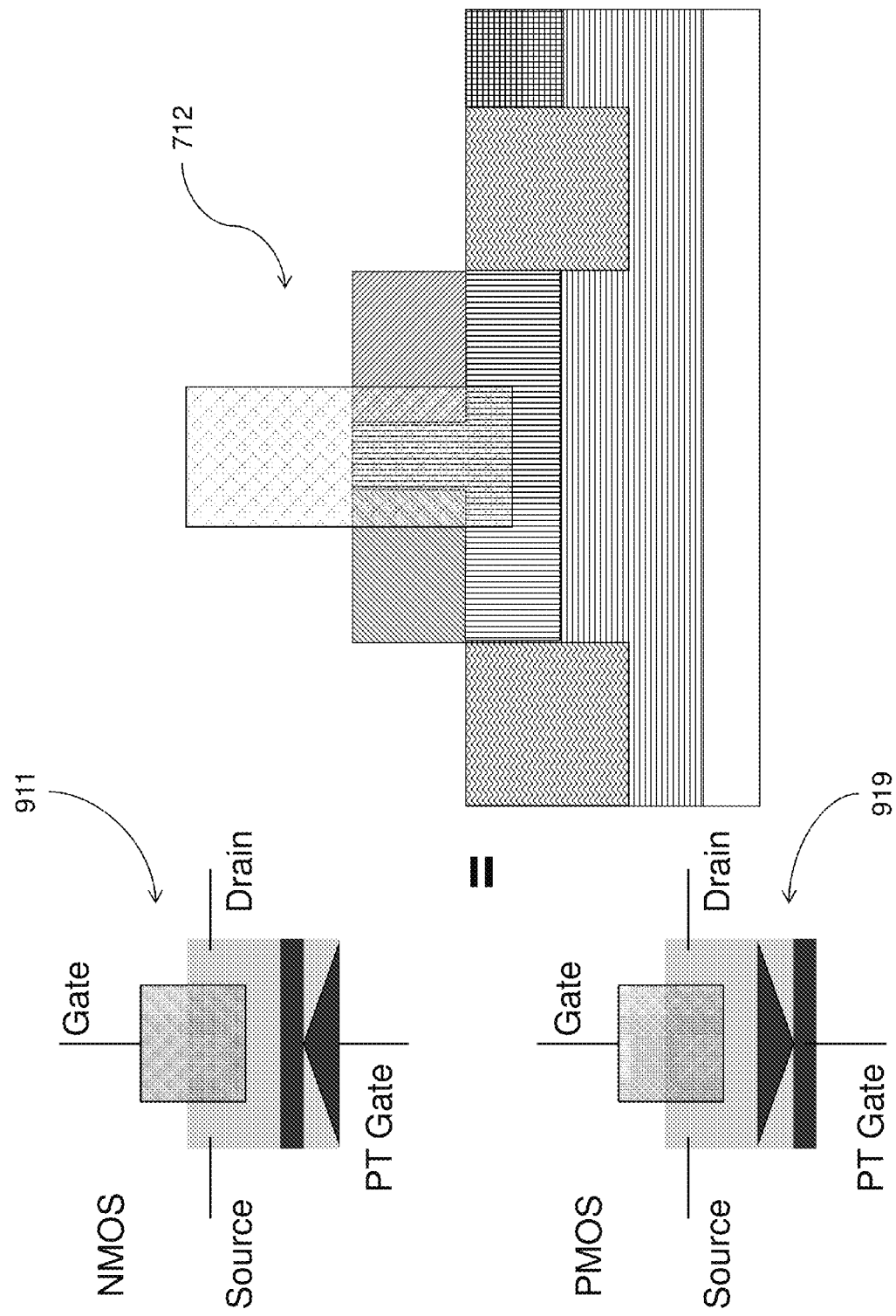
FIG. 9 is an illustration of an exemplary NMOS and PMOS FinFET according to systems and methods herein.

FIG. 9 illustrates that the conductive layer 107 of the FinFET 712 can be appropriately doped to function as an NMOS transistor 911 or PMOS transistor 919. For the NMOS transistor 911, the PT Gate represents the n-well voltage (Vn-well=Vdd+Vp-bias). For the PMOS transistor 919, the PT Gate represents the p-well voltage (Vp-well=Vss+Vn-bias).

Figure 10:
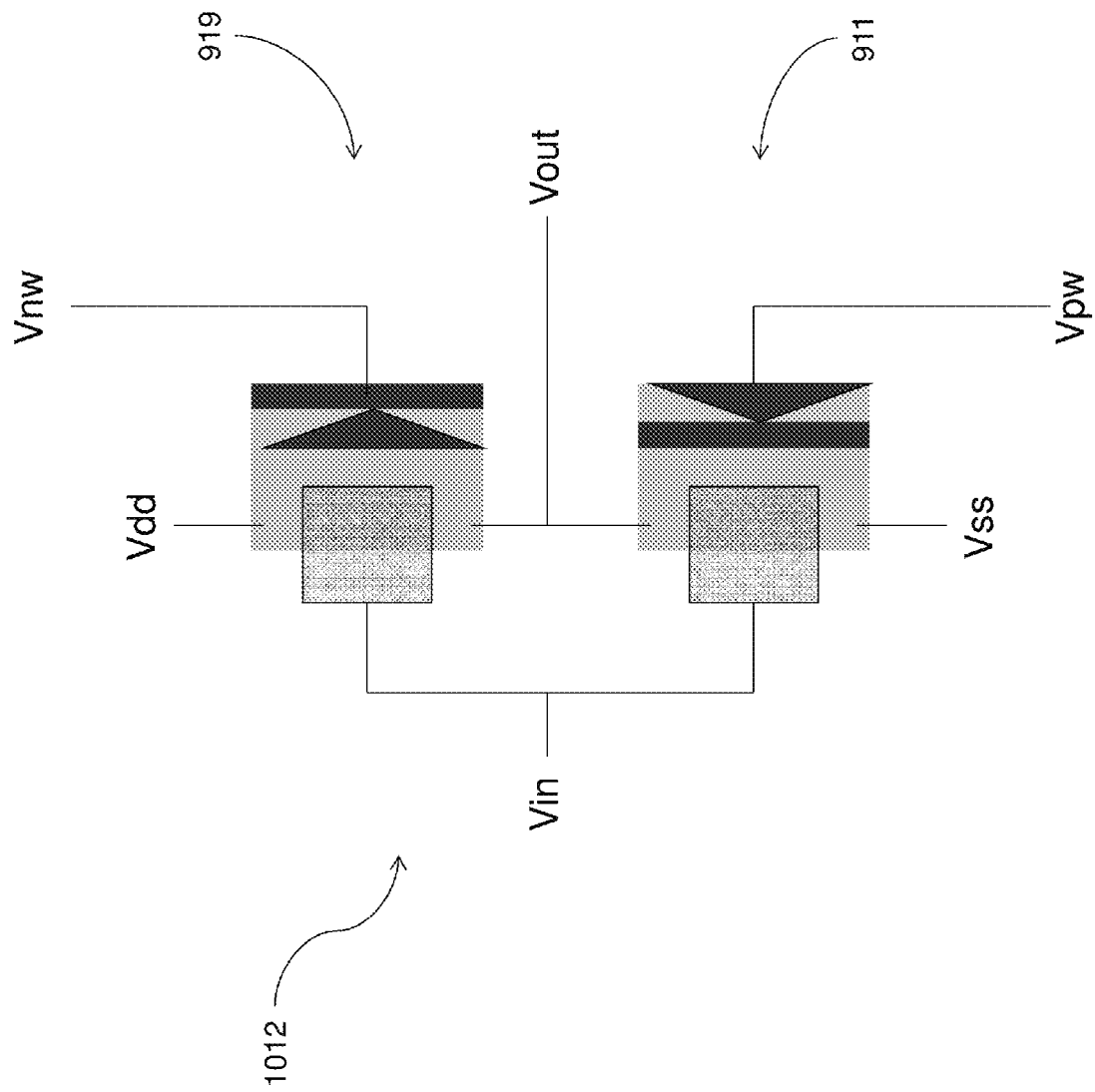
FIG. 10 is an illustration of an exemplary FinFET inverter according to systems and methods herein.

As described above, the doped region of the FinFET 712 may be either p-doped or n-doped. Accordingly, the isolation technique described herein can be constructed in n-type and p-type versions of the FinFET 712, each with complementary doping and electrical potentials in order to support complementary metal oxide semiconductor (CMOS) logic levels. For example, FIG. 10 shows an electrical schematic of a pair of FinFETs, one NMOS transistor 911 and one PMOS transistor 919 arranged as an inverter 1012.

Furthermore, it is contemplated that the isolation technique described herein can be extended in the bulk semiconductor regions such that a first common p-well well interconnects a set of sub-fins of n-type structures and a second common n-well well interconnects a set of sub-fins of p-type structures, respectively.

Figure 11:
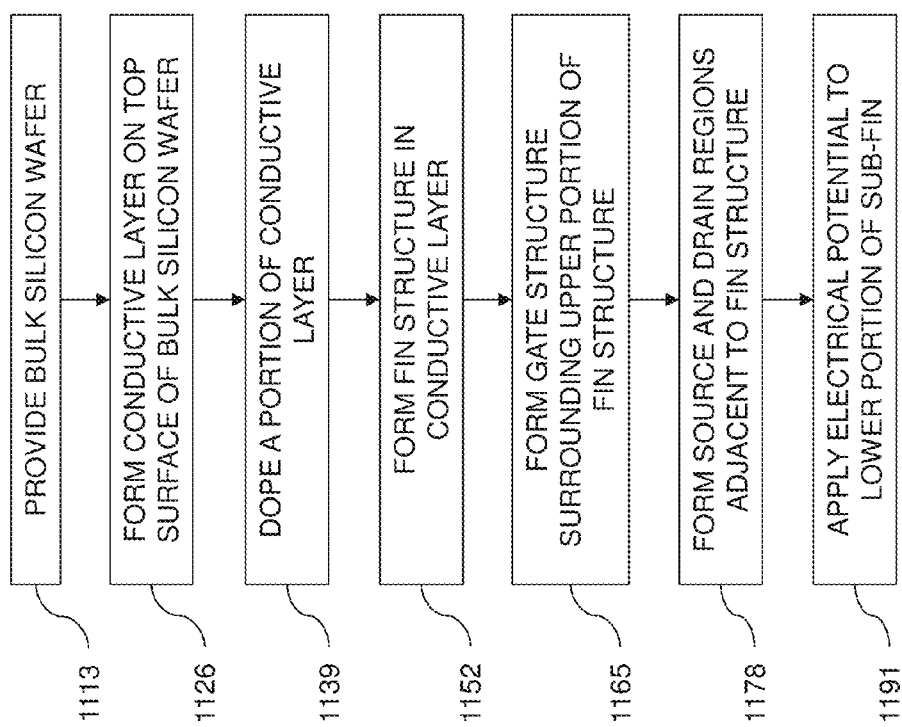
FIG. 11 is a flow diagram illustrating systems and methods herein.

FIG. 11 illustrates a logic flowchart for an isolation technique for bulk FinFETs, according to devices and methods herein. At 1113, a bulk silicon wafer is provided. The bulk silicon wafer has a top surface and a bottom surface. At 1126, a conductive layer is formed on the top surface of the silicon wafer. At 1139, a portion of the conductive layer is doped. A fin structure is formed in the conductive layer, at 1152. The fin structure comprises an upper portion and a lower portion. The upper portion of the fin structure is undoped. The lower portion of the fin structure comprises a sub-fin. The sub-fin comprises an upper portion and a lower portion. The upper portion of the sub-fin is undoped. The lower portion of the sub-fin is optionally doped. At 1165, a gate structure is formed surrounding the upper portion of the fin structure. At 1178, source and drain regions are formed adjacent to the fin structure. The source and drain regions and the gate structure define a fin field effect transistor (FinFET). At 1191, an electrical potential is applied to the conductive layer and optionally to the lower portion of the sub-fin, reducing leakage currents below the upper portion of the fin structure.

According to exemplary semiconductor devices described herein, a semiconductor device includes a semiconductor substrate. A fin structure 202 is on the semiconductor substrate. The fin structure 202 is perpendicular to the semiconductor substrate and comprises an upper portion 507 and a lower portion 508. A source region 608 and a drain region 609 are adjacent to the fin structure 202. A gate structure 709 surrounds the upper portion 507 of the fin structure 202. A well contact point 205 is provided in the semiconductor substrate. The lower portion 508 of the fin structure 202 comprises a sub-fin 511 between the region surrounded by the gate structure and the semiconductor substrate. The sub-fin 511 directly contacts the semiconductor substrate. The upper portion 507 of the fin structure 202 and an upper portion 514 of the sub-fin 511 are undoped. A lower portion 515 of the sub-fin 511 is doped. An electrical potential 715 applied from the well contact point 205 to the lower portion 515 of the sub-fin 511 reduces leakage currents from the upper portion 507 of the fin structure 202.

With its unique and novel features, the systems and methods herein teach a semiconductor device including a bulk silicon wafer 104 having a top surface and a bottom surface. A conductive layer 107 is formed on the top surface of the silicon wafer 104. The conductive layer 107 has a well contact point 205. An oxide 404 is formed on the conductive layer 107. The conductive layer 107 is between the silicon wafer 104 and the oxide layer 404. The conductive layer 107 comprises a well region 111. A fin structure 202 extends through the oxide layer 404. The fin structure 202 comprises an upper portion 507 and a lower portion 508. The upper portion 507 of the fin structure 202 is undoped. A source region 608 and a drain region 609 are provided adjacent to the fin structure 202. A gate structure 909 surrounds the upper portion 507 of the fin structure 202. The source and drain regions 608, 609 and the gate structure 709 define a fin field effect transistor (FinFET) 712. The lower portion 508 of the fin structure 202 comprises a sub-fin 511 between the region surrounded by the gate structure 709 and the bulk silicon wafer 104. The sub-fin 511 comprises an upper portion 514 and a lower portion 515. The upper portion 514 of the sub-fin 511 is undoped. The lower portion 515 of the sub-fin 511 is doped. A portion of the well region 111 of the conductive layer 107 comprises part of the lower portion 515 of the sub-fin 511. An electrical potential 715 applied from the well contact point 205 to the lower portion 515 of the sub-fin 511 reduces leakage currents from the upper portion 507 of the fin structure 202.

The method as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 12:
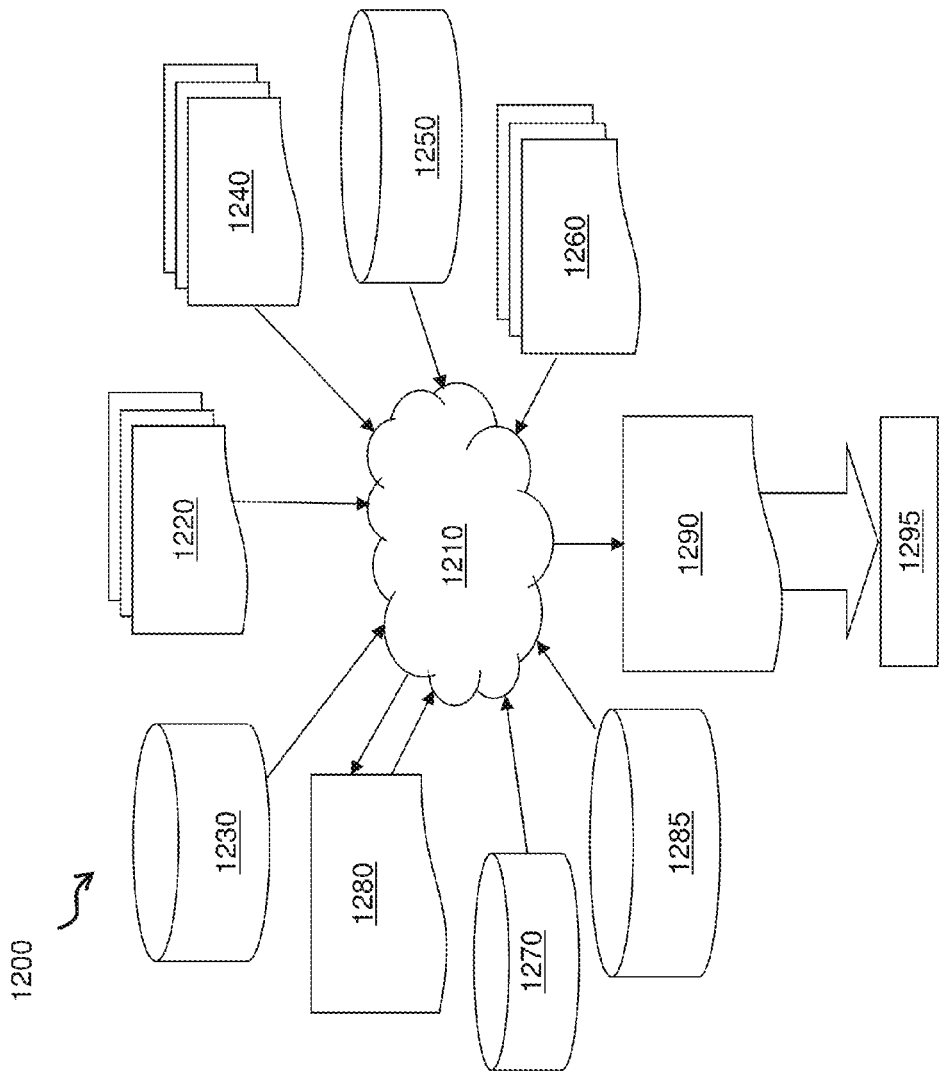
FIG. 12 is a block diagram illustrating an exemplary design flow used, for example, in the logic design, simulation, test, layout, and manufacture of the structures disclosed herein.

FIG. 12 shows a block diagram of an exemplary design flow 1200 used for example, in semiconductor IC logic design, simulation, test, layout, and manufacture. Design flow 1200 includes processes, machines, and/or mechanisms for processing design structures or devices to generate logically or otherwise functionally equivalent representations of the design structures and/or devices described above and shown in FIGS. 1-10. The design structures processed and/or generated by design flow 1200 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 1200 may vary depending on the type of representation being designed. For example, a design flow 1200 for building an application specific IC (ASIC) may differ from a design flow 1200 for designing a standard component or from a design flow 1200 for instantiating the design into a programmable array, for example a programmable gate array (PGA) or a field programmable gate array (FPGA) offered by Altera® Inc. or Xilinx® Inc.

FIG. 12 illustrates multiple such design structures including an input design structure 1220 that is preferably processed by a design process 1210. Design structure 1220 may be a logical simulation design structure generated and processed by design process 1210 to produce a logically equivalent functional representation of a hardware device. Design structure 1220 may also or alternatively comprise data and/or program instructions that when processed by design process 1210, generate a functional representation of the physical structure of a hardware device. Whether representing functional and/or structural design features, design structure 1220 may be generated using electronic computer-aided design (ECAD) such as implemented by a core developer/designer. When encoded on a machine-readable data transmission, gate array, or storage medium, design structure 1220 may be accessed and processed by one or more hardware and/or software modules within design process 1210 to simulate or otherwise functionally represent an electronic component, circuit, electronic or logic module, apparatus, device, or system such as those shown in FIGS. 1-10. As such, design structure 1220 may comprise files or other data structures including human and/or machine-readable source code, compiled structures, and computer executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher-level design languages such as C or C++.

Design process 1210 preferably employs and incorporates hardware and/or software modules for synthesizing, translating, or otherwise processing a design/simulation functional equivalent of the components, circuits, devices, or logic structures shown in FIGS. 1-10 to generate a Netlist 1280 which may contain design structures such as design structure 1220. Netlist 1280 may comprise, for example, compiled or otherwise processed data structures representing a list of wires, discrete components, logic gates, control circuits, I/O devices, models, etc., that describes the connections to other elements and circuits in an integrated circuit design. Netlist 1280 may be synthesized using an iterative process in which Netlist 1280 is resynthesized one or more times depending on design specifications and parameters for the device. As with other design structure types described herein, Netlist 1280 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1210 may include hardware and software modules for processing a variety of input data structure types including Netlist 1280. Such data structure types may reside, for example, within library elements 1230 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1240, characterization data 1250, verification data 1260, design rules 1270, and test data files 1285 which may include input test patterns, output test results, and other testing information. Design process 1210 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1210 without deviating from the scope and spirit of the invention. Design process 1210 may also include modules for performing standard circuit design processes such as timing analysis, verification, design rule checking, place and route operations, etc.

Design process 1210 employs and incorporates logic and physical design tools such as HDL compilers and simulation model build tools to process design structure 1220 together with some or all of the depicted supporting data structures along with any additional mechanical design or data (if applicable), to generate a second design structure 1290. Design structure 1290 resides on a storage medium or programmable gate array in a data format used for the exchange of data of mechanical devices and structures (e.g., information stored in a IGES, DXF, Parasolid XT, JT, DRG, or any other suitable format for storing or rendering such mechanical design structures). Similar to design structure 1220, design structure 1290 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-10. In one embodiment, design structure 1290 may comprise a compiled, executable HDL simulation model that functionally simulates the devices shown in FIGS. 1-10.

Design structure 1290 may also employ a data format used for the exchange of layout data of integrated circuits and/or symbolic data format (e.g., information stored in a GDSII (GDS2), GL1, OASIS, map files, or any other suitable format for storing such design data structures). Design structure 1290 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-10. Design structure 1290 may then proceed to a stage 1295 where, for example, design structure 1290: proceeds to tape-out, is released to manufacturing, is released to a mask house, is sent to another design house, is sent back to the customer, etc.

Aspects of the present disclosure are described herein with reference to flowchart illustrations and/or block diagrams of methods, apparatus (systems), and computer program products according to systems and methods herein. It will be understood that each block of the flowchart illustrations and/or two-dimensional block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 13:
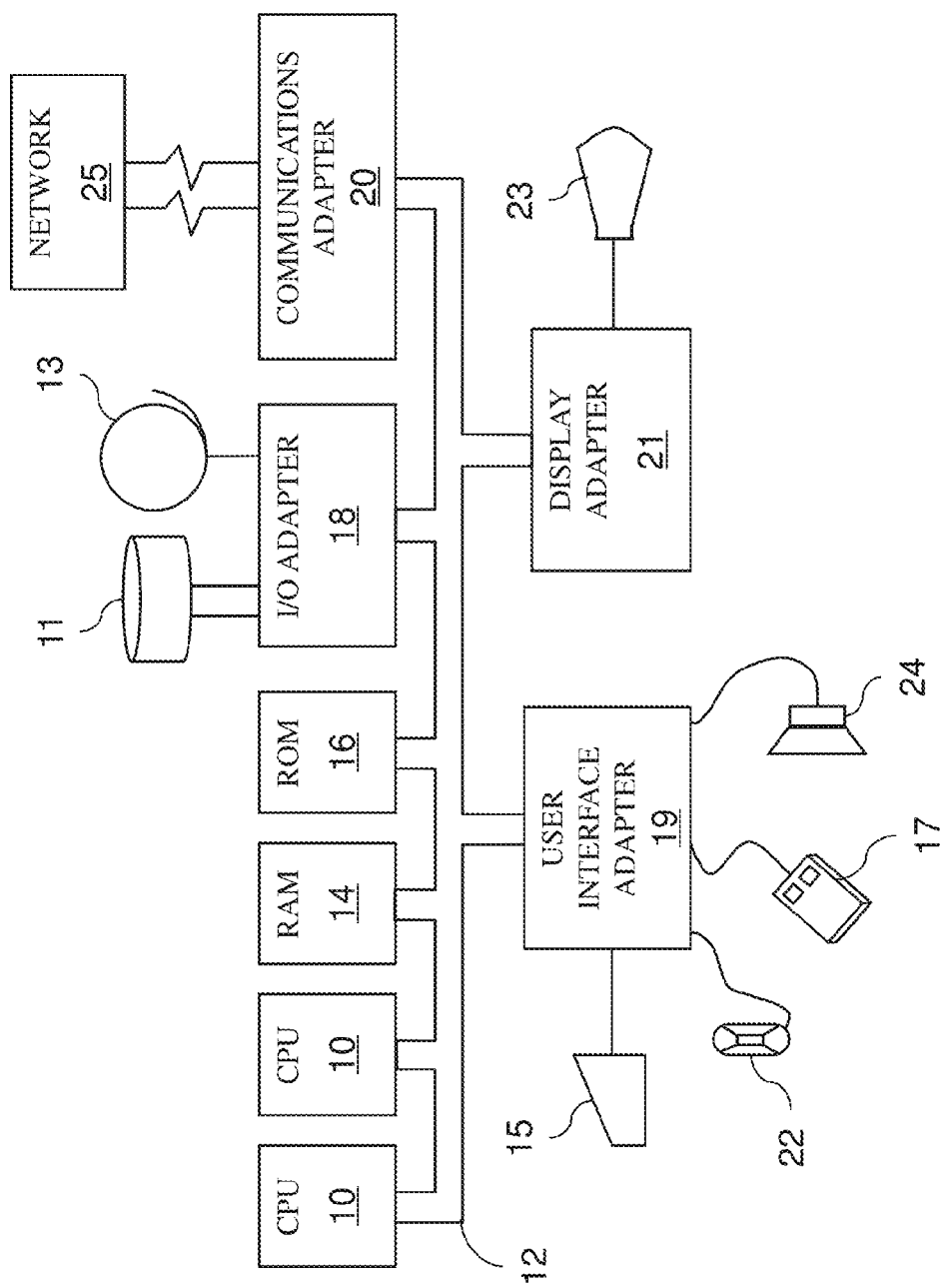
FIG. 13 is a schematic diagram illustrating an exemplary hardware system that can be used in the implementation of the design flow of FIG. 12 according to systems and methods herein.

A representative hardware environment for implementing the systems and methods herein is depicted in FIG. 13. This schematic drawing illustrates a hardware configuration of an information handling/computer system in accordance with the systems and methods herein. The system comprises at least one processor or central processing unit (CPU) 10. The CPUs 10 are interconnected via system bus 12 to various devices such as a Random Access Memory (RAM) 14, Read Only Memory (ROM) 16, and an Input/Output (I/O) adapter 18. The I/O adapter 18 can connect to peripheral devices, such as disk units 11 and tape drives 13, or other program storage devices that are readable by the system. The system can read the instructions on the program storage devices and follow these instructions to execute the methodology of the systems and methods herein.

In FIG. 13, CPUs 10 perform various processing based on a program stored in a Read Only Memory (ROM) 16 or a program loaded from a peripheral device, such as disk units 11 and tape drives 13 to a Random Access Memory (RAM) 14. In the RAM 14, required data when the CPU 10 performs the various processing, or the like, is also stored, as necessary. The CPU 10, the ROM 16, and the RAM 14 are connected to one another via a bus 12. An input/output adapter 18 is also connected to the bus 12 to provide an input/output interface, as necessary. A removable medium, such as a magnetic disk, an optical disk, a magneto-optical disk, a semiconductor memory, or the like, is installed on the peripheral device, as necessary, so that a computer program read therefrom may be installed into the RAM 14, as necessary.

The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 including a network interface card such as a LAN card, a modem, or the like connects the bus 12 to a data processing network 25. The communication adapter 20 performs communication processing via a network such as the Internet. A display adapter 21 connects the bus 12 to a display device 23, which may be embodied as an output device such as a monitor (such as a Cathode Ray Tube (CRT), a Liquid Crystal Display (LCD), or the like), printer, or transmitter, for example.

The flowchart and block diagrams in the Figures illustrate the architecture, functionality, and operation of possible implementations of systems, methods, and computer program products according to various examples disclosed herein. In this regard, each block in the flowchart or block diagrams may represent a module, segment, or portion of code, which comprises one or more executable instructions for implementing the specified logical function(s). It should also be noted that, in some alternative implementations, the functions noted in the block might occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should be understood that the terminology used herein is for the purpose of describing particular examples of the disclosed structures and methods and is not intended to be limiting of this disclosure. For example, as used herein, the singular forms "a", "an", and "the" are intended to include the plural forms as well, unless the context clearly indicates otherwise. Additionally, as used herein, the terms "comprises," "comprising," and/or "including," when used in this specification, specify the presence of stated features, integers, steps, operations, elements, and/or components, but do not preclude the presence or addition of one or more other features, integers, steps, operations, elements, components, and/or groups thereof.

Furthermore, as used herein, terms such as "right", "left", "vertical", "horizontal", "top", "bottom", "upper", "lower", "under", "below", "underlying", "over", "overlying", "parallel", "perpendicular", etc., are understood to be relative locations as they are oriented and illustrated in the drawings (unless otherwise indicated). Terms such as "touching", "on", "in direct contact", "abutting", "directly adjacent to", etc., are intended to indicate that at least one element physically contacts another element (without other elements separating the described elements).

The corresponding structures, materials, acts, and equivalents of all means or step plus function elements in the claims below are intended to include any structure, material, or act for performing the function in combination with other claimed elements as specifically claimed. The descriptions of the various examples of the present disclosure have been presented for purposes of illustration, but are not intended to be exhaustive or limited to the systems and methods disclosed. Many modifications and variations will be apparent to those of ordinary skill in the art without departing from the scope and spirit of the described examples. The terminology used herein was chosen to best explain the principles of the disclosed systems and methods, the practical application or technical improvement over technologies found in the marketplace, or to enable others of ordinary skill in the art to understand the systems and methods disclosed herein.

What is claimed is:

1. A semiconductor device comprising:
   a semiconductor substrate;
   a fin structure on said semiconductor substrate, said fin structure being perpendicular to said semiconductor substrate and comprising an upper portion and a lower portion;
   a source region and a drain region adjacent to said fin structure;
   a gate structure surrounding said upper portion of said fin structure;
   a well region below said fin structure; and
   a well contact point in said semiconductor substrate,
   said lower portion of said fin structure comprising a sub-fin, said sub-fin being between the region surrounded by said gate structure and said semiconductor substrate, said sub-fin directly contacting said semiconductor substrate, said sub-fin comprising an upper portion of said sub-fin and a lower portion of said sub-fin,
   said upper portion of said fin structure and said upper portion of said sub-fin being undoped, and
   an electrical potential applied from said well contact point to said lower portion of said sub-fin through said well region reducing leakage currents from said upper portion of said fin structure.

2. The semiconductor device according to claim 1, wherein said lower portion of said sub-fin is doped.

3. The semiconductor device according to claim 1, said semiconductor substrate further comprising:
   a bulk silicon wafer having a top surface and a bottom surface; and
   a conductive layer formed on said top surface of said bulk silicon wafer.

4. The semiconductor device according to claim 3, said semiconductor substrate further comprising:
   an undoped silicon layer formed on a top surface of said conductive layer relative to said bulk silicon wafer.

5. The semiconductor device according to claim 3, said conductive layer further comprising said well contact point.

6. The semiconductor device according to claim 3, said conductive layer comprising said well region.

7. The semiconductor device according to claim 6, said fin structure being above said well region relative to said semiconductor substrate.

8. The semiconductor device according to claim 3, further comprising:
   an oxide layer on said conductive layer, said conductive layer being between said bulk silicon wafer and said oxide layer.

9. The semiconductor device according to claim 1, said source region, said drain region, and said gate structure defining a fin field effect transistor (FinFET).

10. A semiconductor device comprising:
    a bulk silicon wafer having a top surface and a bottom surface;
    a conductive layer formed on said top surface of said bulk silicon wafer, said conductive layer having a well contact point;
    an oxide layer on said conductive layer, said conductive layer being between said bulk silicon wafer and said oxide layer, said conductive layer comprising a well region;
    a fin structure extending through said oxide layer, said fin structure comprising an upper portion and a lower portion, said upper portion of said fin structure being undoped;
    a source region and a drain region adjacent to said fin structure; and
    a gate structure surrounding said upper portion of said fin structure, said source and drain regions and said gate structure defining a fin field effect transistor (FinFET),
    said lower portion of said fin structure comprising a sub-fin between the region surrounded by said gate structure and said bulk silicon wafer, said sub-fin comprising an upper portion and a lower portion, said upper portion of said sub-fin being undoped, said lower portion of said sub-fin being doped,
    a portion of said well region of said conductive layer comprising part of said lower portion of said sub-fin, and
    an electrical potential applied from said well contact point to said lower portion of said sub-fin through said well region reducing leakage currents from said upper portion of said fin structure.

11. The semiconductor device according to claim 10, further comprising:
    n-type versions of said fin structure; and
    p-type versions of said fin structure, said n-type versions of said fin structure and said p-type versions of said fin structure having complementary doping and electrical potentials.

12. The semiconductor device according to claim 11, further comprising:
said n-type versions of said fin structure and said p-type versions of said fin structure having complementary doping and electrical potentials creating complementary metal-oxide-semiconductor (CMOS) structures.

13. The semiconductor device according to claim 10, further comprising:
a first common p-well well interconnecting a first set of sub-fins of n-type structures; and
a second common n-well well interconnecting a second set of sub-fins of p-type structures.

* * * * *